United States Patent [19]

Costello et al.

[11] Patent Number: 4,929,867
[45] Date of Patent: May 29, 1990

[54] TWO STAGE LIGHT CONVERTING VACUUM TUBE

[75] Inventors: Kenneth A. Costello; Hugh F. MacMillan, both of Palo Alto, Calif.

[73] Assignee: Varian Associates, Inc., Palo Alto, Calif.

[21] Appl. No.: 202,640

[22] Filed: Jun. 3, 1988

[51] Int. Cl.$^5$ .............................................. H01J 40/06
[52] U.S. Cl. .................................... 313/525; 313/523; 313/526; 313/530
[58] Field of Search ............... 313/526, 523, 366, 525, 313/530, 467

[56] References Cited

U.S. PATENT DOCUMENTS

| 2,270,373 | 1/1942 | Kallmann et al. | 313/525 X |
| 3,571,646 | 3/1972 | Kiuchi et al. | |
| 3,575,628 | 4/1971 | Word, IV | 313/525 X |
| 3,644,770 | 2/1972 | Bell | |
| 3,696,262 | 10/1972 | Antypas | 313/530 |
| 3,699,401 | 10/1972 | Tietjfn et al. | 313/526 X |
| 3,769,536 | 10/1973 | Antypas et al. | |
| 3,959,045 | 5/1976 | Antypas | |
| 4,626,694 | 12/1986 | Sano et al. | 313/525 X |

FOREIGN PATENT DOCUMENTS

| 736212 | 5/1980 | U.S.S.R. | 313/525 |
| 1298877 | 12/1972 | United Kingdom |  |
| 1427209 | 3/1976 | United Kingdom |  |

OTHER PUBLICATIONS

U. Levy and E. I. Gordon, "Laser Cathode Ray Tube with a Semiconductor Double-Heterostructure Screen", IEEE Electron Device Letters, vol. EDL-4, No. 5, May 1983.

Primary Examiner—Palmer C. DeMeo
Attorney, Agent, or Firm—Stanley Z. Cole; Gerald M. Fisher; David Schnapf

[57] ABSTRACT

Shown is an integral two-stage vacuum tube with means for efficient optical coupling of the light from an output screen of the first stage into the photocathode of the second stage.

1 Claim, 1 Drawing Sheet

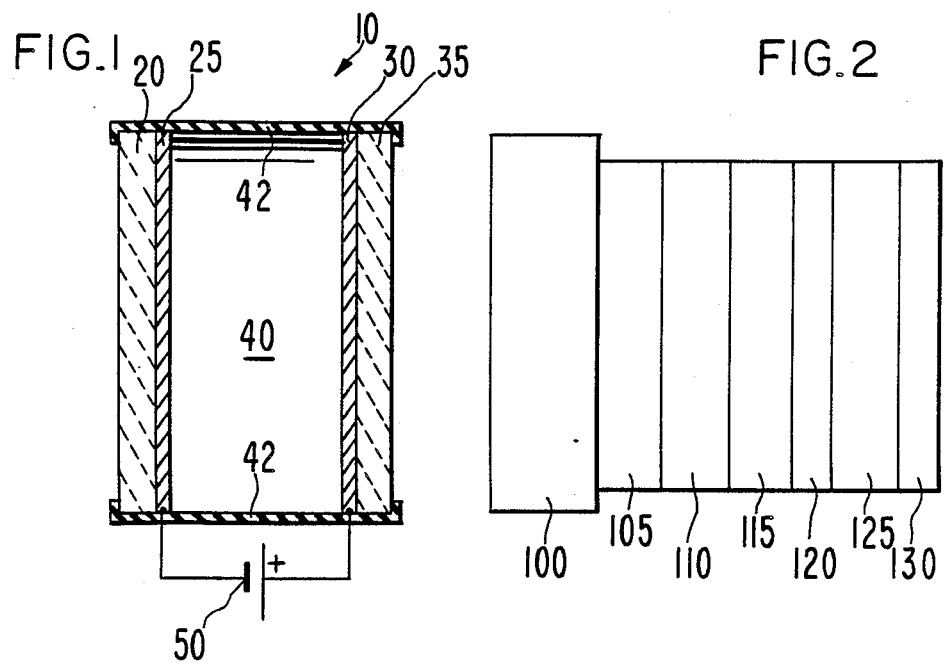
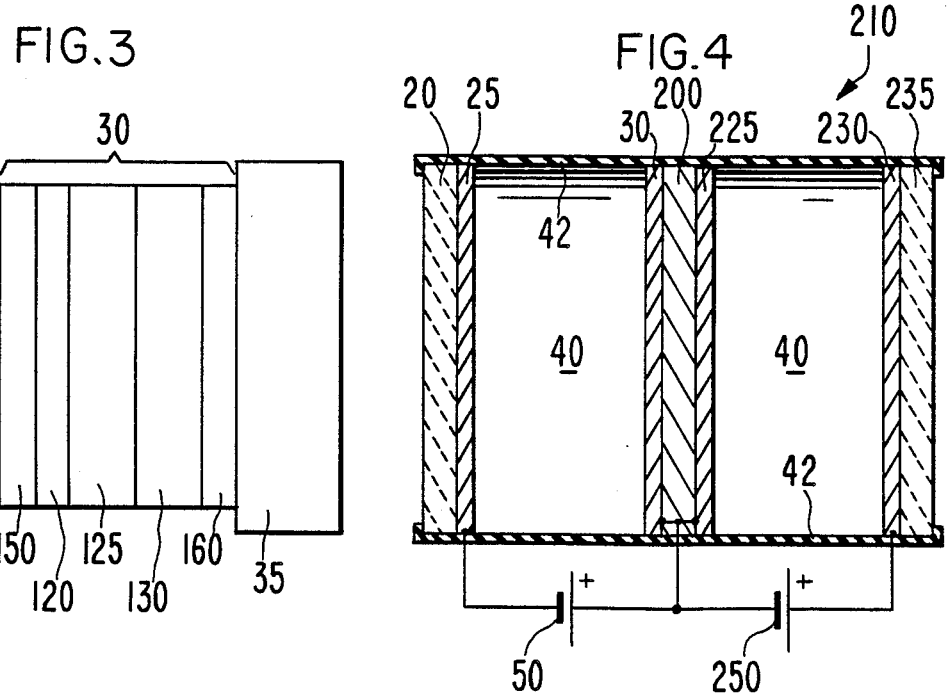

TWO STAGE LIGHT CONVERTING VACUUM TUBE

FIELD OF THE INVENTION

This invention is in the field of light output vacuum tubes and particularly relates to the output screen of a vacuum tube whereby electrons are converted to light.

BACKGROUND OF THE INVENTION

A variety of vacuum tubes are designed to produce a light output by converting a flow of electrons into photons at an output screen. Typically, the light output forms an image, displays a signal or signals an event, i.e., acts as a detector or counter. Well known examples of such tubes include cathode ray tubes, x-ray image intensifier tubes, infrared detectors and night vision tubes. As used in this description the term light output is intended to include the output of photons in the infrared region of the electromagnetic spectrum.

The input signal in many types of such tubes also consists of photons which are converted into electrons at a photocathode and amplified before being converted back to photons at the output screen. Such tubes may be designed for sensitivity to input photons which are in a different region of the spectrum than the output photons.

Certain image intensifiers and detector tubes now employ input photocathodes comprising Gallium Arsenide (GaAs) or other III-V semiconductor compounds. While photocathodes comprising III-V semiconductor compounds offer advantages which make them indispensable in certain applications, they are particularly susceptible to contamination by ions and neutral gas molecules which may be released in the vacuum tube during normal operation. Since the photocathode is negatively biased, any positive ions present in the tube will be attracted towards it. Bombardment of the photocathode by such ions create crystal defects in the semiconductor layer, and sputters away both the cesium/cesium oxide layers and semiconductor layers ultimately destroying the photocathode. Tube life may be rendered unacceptably short by these effects. In addition to degrading tube life, ion feedback is a source of noise. When an ion strikes the photocathode, a large number of secondary electrons are produced. These electrons are then accelerated back into the screen where they show up as a flash of light. These flashes or scintillations are a significant source of noise in proximity focused image intensifiers.

The output screens of light output vacuum tubes are traditionally made of a "phosphor." There are a large number of commercially available phosphor materials with well-known and well described properties. In selecting an output phosphor, the tube designer is interested in selecting one which offers a desired efficiency, color (i.e., spectral characteristics), response time and persistence.

The phosphor output screen is typically made by applying a slurry comprising uniformly sized particles of the phosphor material(s) suspended in a solvent to a glass window which forms a part of the vacuum envelop. Alternatively, one may apply a lacquer to the output window and then brush the dry phosphor powder onto the wet lacquer. While these are relatively easy processes, it is difficult to precisely control the uniformity of the resulting phosphor film.

After the slurry or lacquer is dried, a thin coating of aluminum may be sputtered or evaporated on top of the phosphor to provide electrical contact and to prevent light emitted in the output screen from feeding back to the photocathode. Phosphor screens of the type described have gained almost universal application because they are easy to manufacture, can be selected to offer a desired spectral response and offer high efficiency conversion of electrons to output photons. It should be noted, however, that high efficiency typically comes at a cost of slower response time.

Unfortunately, the traditional phosphor screens, even when coated with a layer of aluminum, release unacceptably high numbers of ions and neutral gas particles when used in a diode tube employing a GaAs or other III-V compound input photocathode. Normal vacuum tube manufacturing techniques such as long tube pump downs and bake outs do not entirely eliminate the problem. It will be recognized that the phosphor screens, comprising a very large number of individual particles, have a very large relative surface area. In night vision tubes using III-V photocathodes, it has heretofore been found necessary to place a physical barrier between the output screen and the photocathode to prevent ions released from the output screen from reaching the photocathode. Even with such a barrier, tube life is limited by the eventual degradation of the photocathode. In certain types of tubes, such as diode photodetectors, a physical barrier is not easily inserted. Furthermore, when used, physical barriers degrade the effective sensitivity of the detector.

Accordingly, it is an object of this invention to provide a light producing output screen having a relatively small surface area for the adsorption of gasses which is particularly useful in tubes employing a III-V semiconductor photocathode.

Another object of this invention is to provide a light producing output screen which is highly uniform.

A further object of this invention is to provide a light producing output screen which is low in noise, is highly efficient and has a very fast response time.

Yet another object of this invention is to provide a light producing output screen comprising a single crystal III-V semiconductor compound as a photon emitter which minimizes losses due to non-radiative recombination of the minority carries at the crystal surface.

SUMMARY OF THE INVENTION

In the instant invention, the normal phosphor output screen of a light output vacuum tube having a photocathode subject to poisoning by ion bombardment is replaced with an output screen comprising a single crystal semiconductor of GaAs, InGaAs, or AlGaAs other III-V or II-VI compounds. In the preferred embodiments of the invention, means are included for minimizing nonradiative recombination losses at the surface of the crystal by including one or more confining layers and/or by employing a doping gradient in the output layer.

The single crystal screen has a much lower surface area than a traditional phosphor screen and therefore contains much less adsorbed gas available for contamination of the photocathode. Thus, the ion current produced from the output screen is very low. In addition, the output screen of the present invention has a very fast response time and a higher internal conversion efficiency than available phosphors which have equally fast response times.

Finally, the present invention provides a output screen with greater uniformity than traditional phosphor screens and which is able to better withstand rigorous surface cleaning, such as a hard electron scrub, as part of the tube manufacturing process.

BRIEF DESCRIPTION OF THE DRAWINGS

FIG. 1 is a cross section of a diode wafer tube employing the output screen of the present invention.

FIG. 2 is a schematic representation of the crystal growth steps employed in manufacturing a preferred embodiment of the present invention.

FIG. 3 is a schematic representation of an output screen in accordance with the present invention.

FIG. 4 is a cross section of a two-stage vacuum tube in accordance with another embodiment of the invention.

DESCRIPTION OF THE PREFERRED EMBODIMENTS

FIG. 1 is a schematic representation of a diode 10 employing the present invention. Such a diode may be used either as a photodetector or as a simple proximity focused image intensifier. Diode 10 comprises an input window 20 which should be transparent to photons in the range of wavelengths of interest. After passing through the input window 20 these photons are absorbed and converted to electrons in photocathode 25. The present invention is particularly useful in tubes wherein the photocathode comprises a crystal of GaAs, InGaAs or other III-V semiconductor compounds which are highly susceptible to "poisoning" or deactivation in the presence of contaminants.

As used in this discussion the term "III-V semiconductor" should be understood to mean a crystalline alloy or compound substantially consisting of atoms of one or more of the elements in column III of the periodic table and a substantially equal number of atoms of one or more of the elements in column V of the periodic table. Such semiconductor crystals can be grown by a variety of known techniques, including, for example, metal organic chemical vapor deposition (MOCVD) and are typically doped by well known methods. Examples of such photocathodes and of methods of making them are described in U.S. Pat. Nos. 3,644,770 and 3,959,045.

Electrons are emitted from the photocathode 25, enter the vacuum space within the tube 10 and are accelerated toward the output screen 30 by an electric field applied between photocathode 25 and output screen 30 by power supply 50. In a simple diode detector, power supply 50 may provide a forward bias in the range of 10-20 Kv.

After transitting the interior of the tube 10 the electrons released from the photocathode 25 strike the output screen 30 which is mounted on a window 35. Window 35 forms part of the vacuum envelop of the tube 10. In the output screen 30 the electrons are converted back into photons which exit the tube through window 35. The detailed structure of an output screen of the present invention is described more completely below in reference to FIG. 3.

Window 35 is transparent to photons of the wavelength(s) emitted by the output screen and may be plain glass or a fiberoptic plate. In either case the output window 30 may be optically coupled to a second stage device such as a photomultiplier tube, an image intensifier or a charged coupled device.

The energy gained by the electrons in transitting the interior of the tube is responsible for the overall gain of the tube. After being accelerated by the electric field in the tube, a single electron emitted by the photocathode may, in turn, release hundreds of photons in the output screen.

The vacuum envelop for tube 10 is completed by walls 40 which also serve to insulate the photocathode 25 from the output screen 30. The overall shape of the tube 10 typically will be cylindrical.

The procedure for making the output screen of a preferred embodiment of the present invention can be explained in reference to FIG. 2. The process is similar to that set forth in U.S. Pat. No. 3,959,045 to which the reader is referred for additional details. Starting with a bulk crystal substrate of GaAs 100, sequential lattice matched layers are grown on top of each other by MOCVD as follows: a buffer layer of GaAs 105, an etch-stop layer of AlGaAs 110, another layer of GaAs 115, a second thinner etch-stop/cap layer of AlGaAs 120, a GaAs active layer 125, and finally, an AlGaAs cap layer 130. An antireflective coating layer 160 (shown in FIG. 3) and/or one or more passivating layers (as described in U.S. Pat. No. 3,959,045) are then applied to cap layer 130.

The resulting structure is then bonded to output window 35 and the layers 100, 105, 110, and 115 are removed by lapping and etching. A process for bonding the photocathode to the output window is described in U.S. Pat. No. 3,769,536. Two etch-stop layers are used in order to gain better control and precision in removing the right amount of material. Finally, after bonding and removing the inactive layers an aluminum film 150 (shown in FIG. 3) is deposited onto the first AlGaAs etch-stop/cap layer by sputter coating.

The purpose of the aluminum film 150 is to prevent light emitted in the output screen 30 from reaching the photocathode 25 where it could cause spurious emission of electrons and create an undesired feedback loop. The aluminum layer 150 is, therefore, thick enough to be optically reflective but thin enough to permit the electrons emitted from the photocathode from reaching the active region of the output screen 30 without losing a significant amount of energy.

FIG. 3 shows the resulting output screen structure 30 mounted on output window 35. The active portion of the output screen consists of GaAs layer 125 and AlGaAs cap layers 120 and 130. AlGaAs layer 120 is relatively thin, again thin enough to allow electrons to pass through it unabsorbed. Electrons which pass through layer 150 and layer 120 are absorbed in GaAs layer 125. As an electron is absorbed it generates a large number of electron hole pairs. The number of electron hole pairs created is a function of the energy of the incident electron. Recombination of these pairs results in isotropic photon emission at the bandgap frequency of GaAs, which is in the infrared region of the spectrum. If output light of a different frequency is desired, one can substitute another type of III-V semiconductor compound for GaAs layer 125. By using ternary or quaternary compounds, such as InGaAsP or InGaP, one can achieve both good lattice matching and a desired bandgap frequency.

Even greater wavelength changes can be accomplished by growing the appropriate III-V or II-VI compounds on non-GaAs substrates such as InGaAsP or InP.

By using AlGaAs cap layers 120 and 130 the output screen structure 30 minimizes efficiency losses due to non-radiative recombination of electrons or holes at the surface of the GaAs layer. A crystal surface has a high population of electronically active defects which are responsible for non-radiative recombination. The use of lattice matched cap layers 120 and 130 minimizes the presence of these defects in the active region of the output screen. Thus, in effect, the interface between active layer 125 and cap layers 120 and 130 is not a crystal surface, although the interface serves as a confining layer for the electrons and holes. In order to provide effective minority carrier confinement, the cladding layers 120 and 130 must have the following properties: (1) their bandgap must be of greater energy than that of the active layer 125; (2) the layers must be doped in the same manner as the active layer 125; (3) the cladding layers must be thicker than the characteristic tunneling distance, i.e., 200 Å should be sufficient. It should also be noted that AlGaAs layers 120 and 130 are transparent to light emitted in active GaAs layer 125. When using an active layer of a different semiconductor compound, the composition of the cap layers should, likewise, be selected to both be lattice matched to the active layer and transparent to light emitted by the active layer.

In another embodiment of the invention etch-stop/-cap layer 120 is removed and does not become a part of the final structure. Instead, by diffusion doping the GaAs layer 125 a doping profile is created which accelerates the minority carriers away from the crystal surface where they are subject to non-radiative recombination. Methods of creating a doping profile useful in this embodiment are well known in the art.

One limiting factor associated with the use of a single crystal semiconductor output screen of the present invention, as depicted in FIG. 3, is the inability to get all the light produced in the active layer 125 out of the tube 10. Light cannot exit the photocathode 30 into a medium with a lower index of refraction if the angle of incidence at the interface between the materials exceeds the "critical" angle. The greater the difference between the indices of refraction of the two materials at the interface, the smaller the critical angle and the less light that can escape. It is noted that GaAs has a relatively high index of refraction. However, this is not a serious problem in transmitting light from the GaAs layer into the AlGaAs cap layer 130 because it has an index of refraction similar to GaAs. However, glass has a much lower index of refraction and consequently the critical angle becomes much smaller at that interface.

One way of avoiding this limitation is to roughen or texture the interface in question thereby increasing the opportunity for the light to strike the surface at an angle less than the critical angle.

FIG. 4 shows another approach to avoiding the limitation associated with getting light out of a material having a high index of refraction when the light emitted by the output screen is to be coupled into a second stage tube for further signal amplification. Tube 210 is a two-stage device with each stage comprising essentially the same elements as the FIG. 1 tube 10 except as discussed below. Tube 210 is divided into its two parts by optical coupling/support member 200. Member 200 supports the output screen 30 of the first stage of the tube, which is the same as described above, and photocathode 225, which is the input for the second stage of the tube. Note that member 200 does not serve as any part of the vacuum envelop for the tube and, thus, need not have great strength or thickness. In the preferred embodiment member 200 is a thin substrate, like GaAs, upon which the active layers of output screen 30 and photocathode 225 may be grown directly, simplifying the manufacturing process. Clearly, the substrate material 200 must be transparent to the light generated in layer 30. The effective bandgap of this substrate can be slightly shifted by the use of dopants. The preferred embodiment of this structure makes use of this effect in that layer 30 would contain a P doped active layer whereas the substrate would be undoped or N doped. The active layer of the photocathode, layer 225, would contain a small percentage of Indium to enhance optical absorption of the light generated in layer 30. It should also be noted that if the substrate could be extremely thin, this device would have imaging applications. Since output screen 30, support member 200 and photocathode 225 all have substantially the same index of refraction, the optical coupling between the stages is excellent and light loss due to the critical angle effect is minimized. Needless to say, there is no need to stop at two stages; an integral tube comprising a plurality of stages can be constructed in this manner.

While the two stages of tube 210 are shown to be alike this is not necessary. For example, the second stage could be a photomultiplier tube incorporating a microchannel plate. It is known that the noise figure for a photomultiplier tube is highly dependent on the gain of the first stage. By using a first stage detector of the type described herein, a high gain can be achieved lowering the overall noise of the system.

Likewise, the second stage could contain a microchannel plate followed by a standard phosphor screen.

Since many changes could be made in the above construction and many apparently widely different embodiments of this invention can be made without departing from the scope thereof it is intended that all matter contained in the above description or shown in the accompanying drawings shall be interpreted as illustrative and not in a limiting sense.

What is claimed is:

1. A vacuum tube comprising at least two stages and further comprising,
    an input photocathode in the first stage of said vacuum tube for receiving photons from outside of said vacuum tube and converting them into electrons to be released into a first stage vacuum portion of said tube,
    means within the first stage of said vacuum tube for accelerating said electrons emitted from said photocathode,
    a first stage output screen within the first stage of said vacuum tube for receiving said accelerated electrons and converting the electron energy into photons,
    a second stage photocathode for converting the photons emitted by said first stage output screen into electrons which are released into a second stage vacuum portion of said tube,
    wherein said first stage output screen and said second stage photocathode comprise single crystal III-V semiconductor compounds and said first stage output screen and said second stage photocathode are on opposite sides of and lattice matched to a support member comprising a III-V semiconductor compound.

* * * * *